(12) United States Patent
Carman et al.

(10) Patent No.: US 9,953,825 B2
(45) Date of Patent: Apr. 24, 2018

(54) SYMMETRIC RF RETURN PATH LINER

(71) Applicant: Lam Research Corporation, Fremont, CA (US)

(72) Inventors: David Carman, San Jose, CA (US); Travis Taylor, Fremont, CA (US); Devin Ramdutt, San Francisco, CA (US)

(73) Assignee: Lam Research Corporation, Fremont, CA (US)

( * ) Notice: Subject to any disclaimer, the term of this patent is extended or adjusted under 35 U.S.C. 154(b) by 728 days.

(21) Appl. No.: 13/683,305

(22) Filed: Nov. 21, 2012

(65) Prior Publication Data

US 2013/0133833 A1 May 30, 2013

Related U.S. Application Data

(60) Provisional application No. 61/563,549, filed on Nov. 24, 2011.

(51) Int. Cl.
| | | |
|---|---|---|
| *H01L 21/02* | (2006.01) | |
| *H01L 21/683* | (2006.01) | |
| *H01J 37/32* | (2006.01) | |

(52) U.S. Cl.
CPC ........ *H01L 21/02* (2013.01); *H01J 37/32091* (2013.01); *H01J 37/32477* (2013.01); *H01L 21/6831* (2013.01)

(58) Field of Classification Search
CPC ... C23C 14/50; C23C 14/564; C23C 16/4401; C23C 16/4404; C23C 16/4581; C23C 16/4586; C23C 16/509; C23C 16/5096; C23C 16/505; H01L 21/02; H01L 21/6831; H01L 21/6833; H01L 21/68785; H01L 21/68792

See application file for complete search history.

(56) References Cited

U.S. PATENT DOCUMENTS

| | | |
|---|---|---|
| 5,310,453 A | 5/1994 | Fukasawa et al. |
| 5,556,501 A | 9/1996 | Collins et al. |
| 5,641,375 A * | 6/1997 | Nitescu et al. ............ 156/345.1 |

(Continued)

OTHER PUBLICATIONS

PCT International Search Report—PCT/US2012/66404—dated Jan. 31, 2013 (2 pages).

*Primary Examiner* — Benjamin Kendall
(74) *Attorney, Agent, or Firm* — Martine Penilla Group, LLP

(57) ABSTRACT

An apparatus and system for plasma processing a substrate using RF power includes a chamber having walls for housing an electrostatic chuck (ESC) and a top electrode. The top electrode is oriented opposite the ESC to define a processing region. An inner line with a tubular shaped wall is defined within and is spaced apart from the walls of the chamber and is oriented to surround the processing region. The tubular shaped wall extends a height between a top and a bottom. The tubular shaped wall has functional openings for substrate access and facilities access and dummy openings oriented to define symmetry for selected ones of the functional openings. A plurality of straps are connected to the bottom of the tubular shaped wall of the inner liner and are electrically coupled to a ground ring within the chamber to provide an RF power return path during plasma processing.

15 Claims, 15 Drawing Sheets

(56) References Cited

U.S. PATENT DOCUMENTS

| | | | |
|---|---|---|---|
| 5,993,594 A | 11/1999 | Wicker et al. | |
| 6,129,808 A | 10/2000 | Wicker et al. | |
| 6,170,429 B1 | 1/2001 | Schoepp et al. | |
| 6,227,140 B1* | 5/2001 | Kennedy et al. | 118/723 R |
| 6,261,408 B1* | 7/2001 | Schneider et al. | 156/345.26 |
| 6,277,237 B1 | 8/2001 | Schoepp et al. | |
| 6,296,747 B1* | 10/2001 | Tanaka | 204/298.07 |
| 7,740,736 B2 | 6/2010 | Fischer et al. | |
| 2001/0002613 A1* | 6/2001 | Siniaguine et al. | 156/345 |
| 2002/0102858 A1* | 8/2002 | Wicker et al. | 438/731 |
| 2003/0037881 A1 | 2/2003 | Barnes et al. | |
| 2004/0050327 A1* | 3/2004 | Johnson | H01J 37/32082 118/715 |
| 2004/0149216 A1 | 8/2004 | Osada et al. | |
| 2004/0250955 A1 | 12/2004 | Blonigan et al. | |
| 2005/0139321 A1* | 6/2005 | Higashiura | 156/345.44 |
| 2008/0171444 A1* | 7/2008 | Dhindsa et al. | 438/729 |
| 2009/0107955 A1 | 4/2009 | Tiner et al. | |
| 2009/0173389 A1* | 7/2009 | Fischer | C23C 16/45523 137/2 |
| 2009/0200269 A1* | 8/2009 | Kadkhodayan et al. | 216/71 |
| 2009/0242383 A1* | 10/2009 | Vukovic et al. | 204/164 |
| 2010/0065213 A1 | 3/2010 | Carduci et al. | |
| 2010/0089319 A1 | 4/2010 | Sorensen et al. | |
| 2010/0196626 A1* | 8/2010 | Choi et al. | 427/569 |
| 2011/0135842 A1* | 6/2011 | Faguet et al. | 427/569 |
| 2011/0287632 A1 | 11/2011 | Brown et al. | |
| 2012/0018402 A1* | 1/2012 | Carducci | H01J 37/32082 216/67 |
| 2013/0087286 A1* | 4/2013 | Carducci | H05H 1/46 156/345.43 |
| 2013/0255576 A1* | 10/2013 | Rasheed et al. | 118/723 R |

* cited by examiner

All SRL Strap Configuration Show Improved Plasma Confinement Performance

| | Baseline (8 – 2" Straps) | | SRL (20 – 1" Straps) | | SRL (13 – 2" Straps) | | SRL (10 – 2" Straps) | |
|---|---|---|---|---|---|---|---|---|
| | 2-27 | 2-60 | 2-27 | 2-60 | 2-27 | 2-60 | 2-27 | 2-60 |
| Run 1 | 1000 Ar | 975 Ar | 1350 Ar | 1000 Ar | 1350 Ar | 1000 Ar | 1350 Ar | 1000 Ar |
| Run 2 | 1000 Ar | 975 Ar | 1350 Ar | 950 Ar | 1350 Ar | 1000 Ar | 1350 Ar | 1000 Ar |
| Run 3 | 1000 Ar | 800 Ar | 1350 Ar | 1000 Ar | 1350 Ar | 950 Ar | 1350 Ar | 1000 Ar |

2MHz-27MHz Spec: >1000 Ar
2MHz-60MHz Spec: >750 Ar

2MHz-27MHz and 2MHz-60MHz Confinement Test

Figure 9

SYMMETRIC RF RETURN PATH LINER

CLAIM OF PRIORITY

This application claims priority from U.S. Provisional Patent Application No. 61/563,549 filed on Nov. 24, 2011 and entitled "Symmetric RF Return Path Liner," which is incorporated herein by reference in its entirety for all purposes.

CROSS REFERENCE TO RELATED APPLICATIONS

This application is related to U.S. patent application Ser. No. 13/301,725, filed on Nov. 21, 2011, entitled TRIODE REACTOR DESIGN WITH MULTIPLE RADIOFREQUENCY POWERS"; U.S. Provisional Patent Application No. 61/563,021, filed on Nov. 22, 2011, entitled, "SYSTEMS AND METHODS FOR CONTROLLING A PLASMA EDGE REGION," U.S. Provisional Patent Application No. 61/563,503, filed Nov. 23, 2011, and entitled "PERIPHERAL RF FEED AND SYMMETRIC RF RETURN FOR SYMMETRIC RF DELIVERY," U.S. Provisional Patent Application No. 61/563,545, filed on Nov. 23, 2011, and entitled, "PLASMA PROCESSING CHAMBER WITH FLEXIBLE SYMMETRIC RF RETURN STRAP," all of which are incorporated herein by reference.

BACKGROUND

1. Field of the Invention

The present invention relates to processing of a semiconductor device, and more particularly to chamber design and systems used for etching of semiconductor devices.

2. Description of the Related Art

In the fabrication of semiconductor devices such as integrated circuits, memory cells, and the like, a series of manufacturing operations are performed to define features on substrates, such as semiconductor wafers. Some manufacturing operations, such as etching and deposition, include plasma processing operations that are performed in a plasma processing chamber in which a process gas is transformed into plasma comprising reactive constituents that can perform work on the substrate, when present and exposed thereto. During such plasma processing operations, the substrate is held on an electrostatic chuck and exposed to the plasma. The electrostatic chuck is defined to establish an electrostatic field that attracts the substrate to a supporting surface of the electrostatic chuck, thereby securing the substrate to the electrostatic chuck during plasma processing operations.

During plasma etching process, non-uniform etching can adversely impact device yields from the substrate. As the size of the critical dimension of features formed on the substrate shrinks with each new generation of devices and as the substrate size increases to facilitate production of higher number of devices, etch non-uniformity requirements become more stringent and it becomes more critical to provide improvements to increase device yield. Controlling etch non-uniformity is a goal to achieve in order to enable more advanced technology devices to be produced in a cost-effective manner.

It is in this context that embodiments of the invention arise.

SUMMARY

Embodiments of the present invention provide apparatus and methods for processing a semiconductor substrate in a plasma chamber to enable symmetric RF return for RF power delivery. The apparatus includes a chamber liner that is configured to address the asymmetry issues of conventional chamber liners. The chamber liner, in accordance with various embodiments, improves gas conductance and provides for a symmetrical RF power return path.

It should be appreciated that the present invention can be implemented in numerous ways, such as a process, an apparatus, a system, a device or a method on a computer readable medium. Several inventive embodiments of the present invention are described below.

In one embodiment, a chamber for plasma processing a substrate using RF power is disclosed. The chamber includes walls and is configured to house an electrostatic chuck (ESC) and a top electrode. The top electrode is oriented opposite the ESC to define a processing region. An inner liner with tubular shaped wall is defined within the walls of the chamber and is spaced apart from the walls of the chamber. The inner liner is oriented to surround the processing region and the tubular shaped wall extends a height between a bottom and a top. The tubular shaped wall has functional openings for substrate access and facilities access and includes dummy openings oriented to define symmetry for selected ones of the functional openings. Plurality of straps are connected to the bottom of the tubular shaped wall of the inner liner. The plurality of straps are electrically coupled to a ground ring defined within the chamber to provide an RF power return path during the plasma processing.

In another embodiment, a system for plasma processing a substrate using RF power is disclosed. The system includes a chamber for housing an electrostatic chuck (ESC) and a top electrode. The top electrode is oriented opposite the ESC to define a processing region. An inner liner with tubular shaped wall is defined within the walls of the chamber and is spaced apart from the walls of the chamber. The inner liner is oriented to surround the processing region and the tubular shaped wall extends a height between a bottom and a top. The tubular shaped wall has functional openings for substrate access and facilities access and includes dummy openings oriented to define symmetry for selected ones of the functional openings. Plurality of straps are connected to bottom portion of the tubular shaped wall of the inner liner at one end and are electrically coupled to a ground ring defined within the chamber at an opposite end to provide an RF power return path during the plasma processing. An RF power source is coupled to the electrostatic chuck for providing RF power to the processing region. A process gas source is connected to the top electrode for supplying process gas to the processing region.

In one embodiment, the functional openings are defined as openings that provide one or more functionalities, such as facilitating access to the plasma processing region, routing cables related to the chamber, monitoring process attributes of plasma within the plasma processing region, etc. The various functional openings include a door opening that facilitates insertion and removal of the substrate into and out of the plasma processing region, a set of port openings, such as view port, an access port, an optical emission spectrometer (OES) port, to observe various attributes during plasma processing, and a via for routing connections related to the chamber.

In one embodiment, the plurality of dummy openings include a dummy door opening that is oriented symmetrically opposite to the functional door opening, a set of dummy port openings that are oriented symmetrically opposite to the functional port openings and a dummy via oriented symmetrically opposite to the functional via that is used for routing cables and hardwire connections. The dummy openings and the flexible straps improve gas conductance in the chamber and provide a symmetrical RF power return path.

Other aspects will become apparent from the following detailed description, taken in conjunction with the accompanying drawings.

BRIEF DESCRIPTION OF THE DRAWINGS

The invention may best be understood by reference to the following description taken in conjunction with the accompanying drawings.

FIG. 9 illustrates a graphical comparison of plasma confinement performance using conventional inner chamber liner against the current embodiments, in accordance with one embodiment of the invention.

DETAILED DESCRIPTION

The following embodiments provide systems, and apparatus for processing a semiconductor substrate in a plasma chamber using an inner liner that enables symmetric RF return. It will be apparent that the present embodiments may be practiced without some or all of these specific details. In other instances, well known process operations have not been described in detail in order not to unnecessarily obscure the present embodiments.

Figure 1:
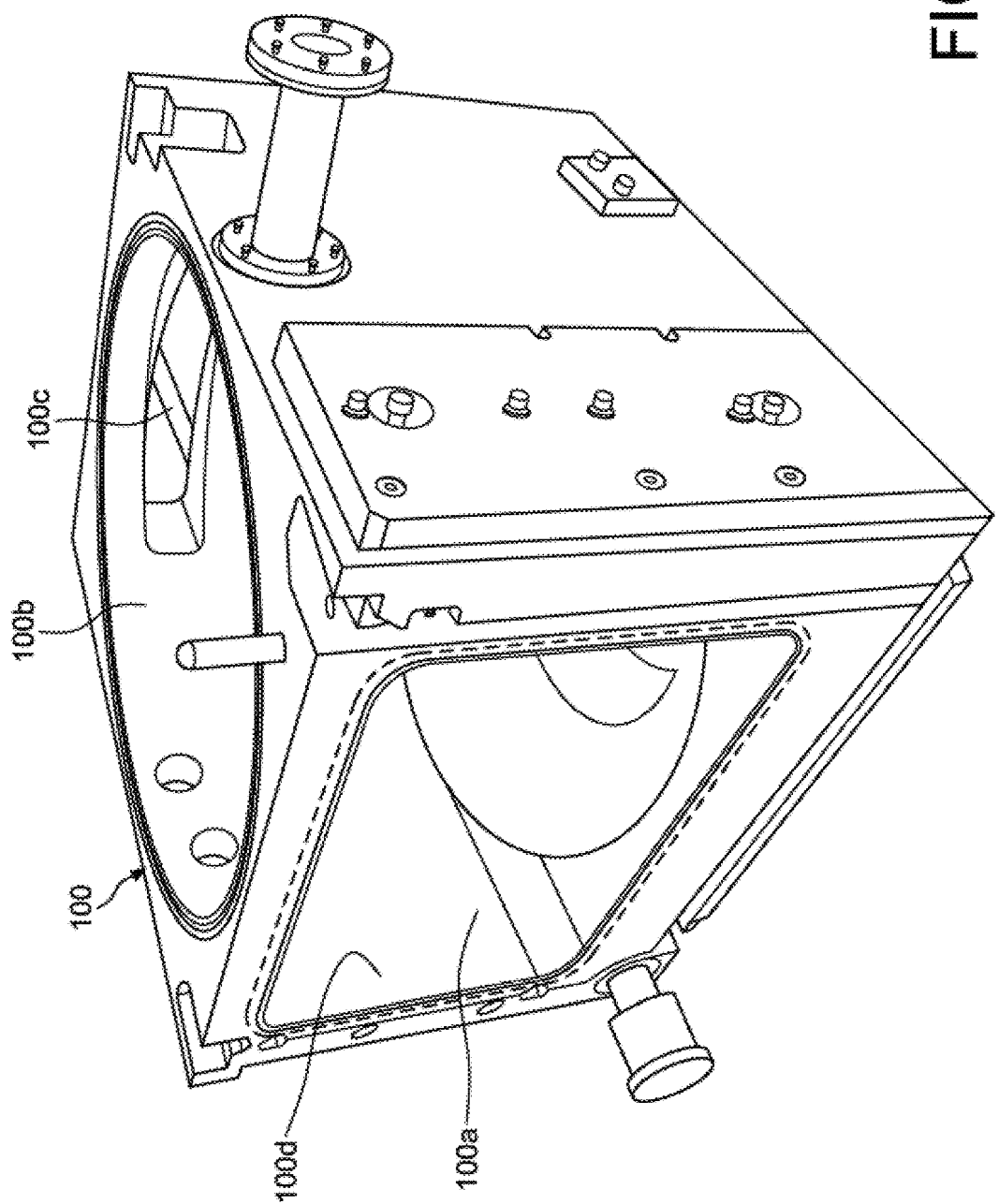
FIG. 1 shows an etching chamber, according to one embodiment.
Figure 1A:
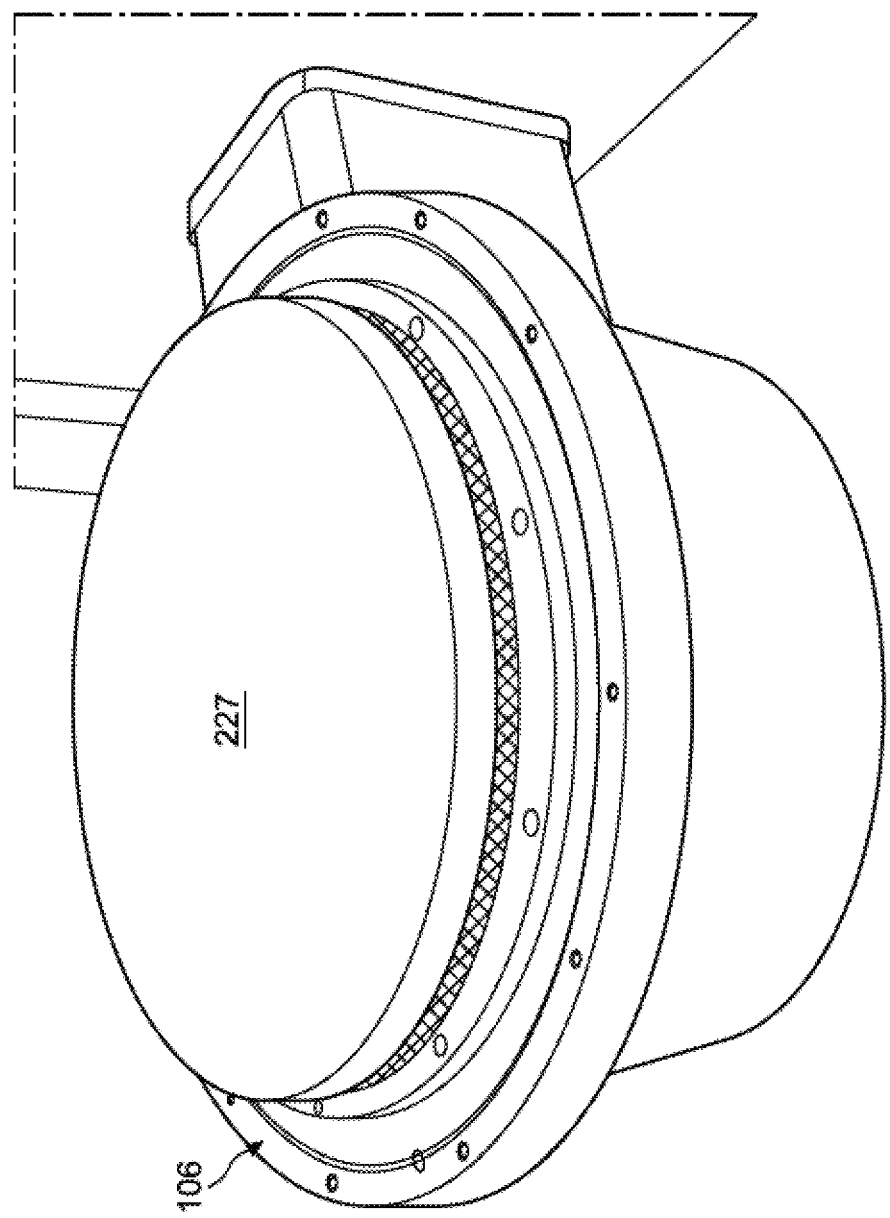
FIG. 1a illustrates a sample chamber liner insert with electrostatic chuck assembly, according to one embodiment.

FIG. 1 shows an exemplary etching chamber 100, according to one embodiment. The chamber, in one embodiment of the invention, is defined from aluminum and the inner surface of the chamber is coated with anodized aluminum. The anodized aluminum coating is exemplary and other materials may be used for coating the inner surface of the chamber so long as the materials are capable of withstanding pressure differentials and temperatures to which they will be exposed during plasma processing, and are chemically compatible with the plasma processing environment. The chamber illustrated in FIG. 1 includes sidewalls 100d that extend a height. The chamber includes an opening 100a for inserting an inner liner and an electrostatic chuck assembly, a top opening 100b for accommodating a top electrode and a door opening 100c for insertion and removal of the substrate for etch processing. The inner liner includes walls that are defined on the inner side of the sidewalls 100d and spaced apart from the sidewalls 100d of the chamber 100. Figure 1a illustrates an exemplary electrostatic chuck assembly 106 that can be inserted through the opening 100a into the processing chamber with the inner liner. The ESC assembly includes an electrostatic chuck 227 for providing a surface to receive the substrate during processing.

Figure 2:
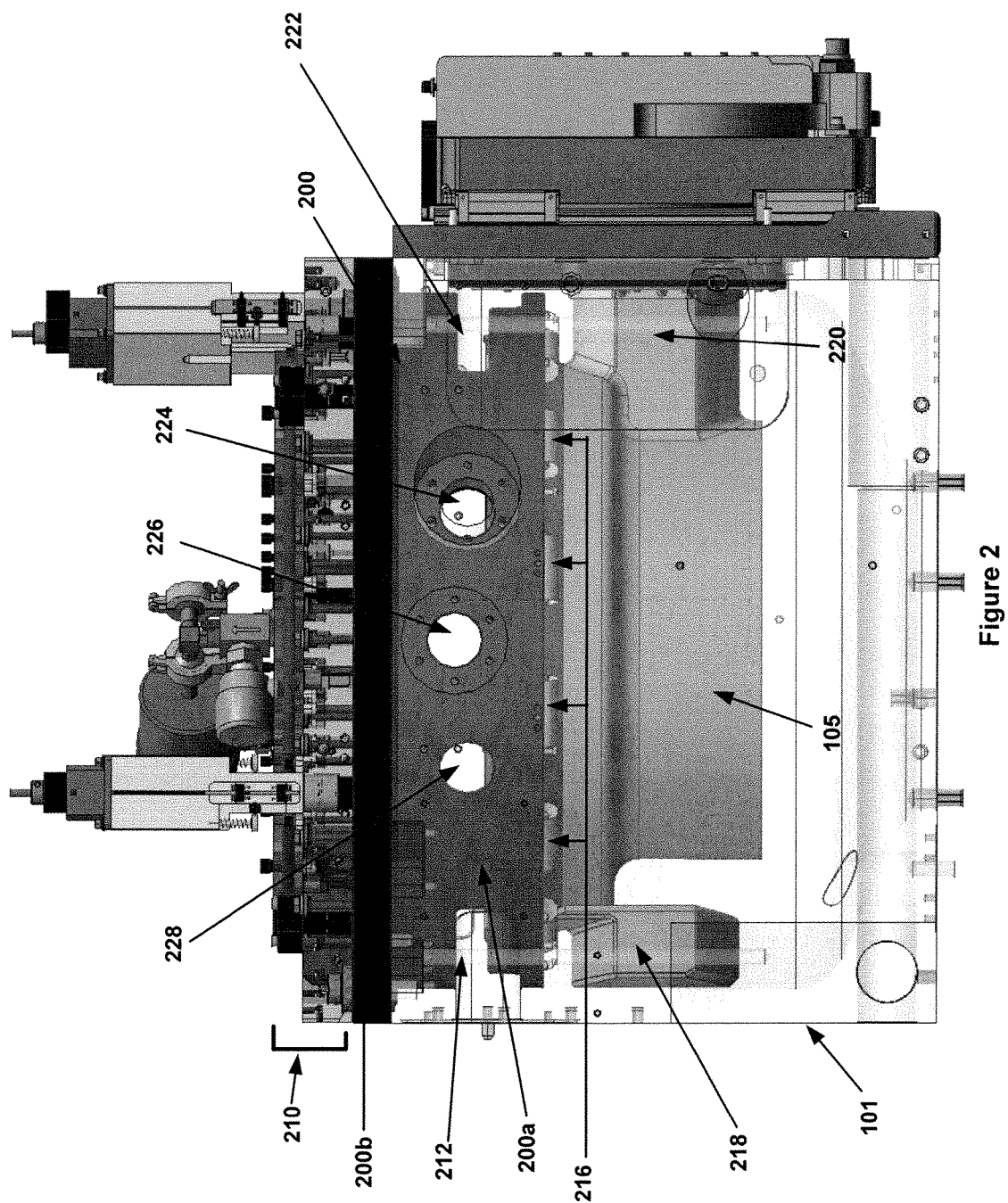
FIG. 2 illustrates an exemplary design of a redesigned symmetrical etch apparatus, in one embodiment of the invention.

FIG. 2 illustrates a cross section of a plasma reactor chamber, in accordance with one embodiment of the invention. The plasma chamber includes a top structure having a top electrode assembly 210 and a bottom electrode assembly 105 that is oriented opposite to the top electrode assembly 210 to define a plasma processing region and chamber sidewalls 101 extending between the top electrode assembly 210 and the bottom electrode assembly 105 encompassing the plasma processing region. An inner liner 200 is inserted into the chamber to cover the inner side 100d of the chamber wall 101 and is spaced apart from the chamber wall 101. The inner liner 200 includes a liner wall 200a that extends the height of the chamber wall 101 and surrounds the plasma confinement region and a liner lip or liner rim 200b. In one embodiment, the liner wall is tubular shaped.

In one embodiment, the top electrode assembly is connected to ground through a plurality of flexible straps and a bottom electrode is coupled to an RF generator to supply RF power to the chamber. The plurality of flexible straps defines a conductive path to allow the RF power to flow to the ground. The top electrode assembly includes a plasma confinement ring structure surrounding the chuck to confine the plasma within the chamber during plasma processing. The confinement ring structure includes a plurality of rings with spacers there-between and is configured to move vertically up and down engaging and disengaging the confinement rings so as to seal or un-seal the plasma processing region during substrate processing. When the top electrode assembly is moved down toward the bottom electrode assembly, the confinement rings are said to be in an engaged position wherein the inter-ring space/gap is narrowed thereby sealing the plasma processing region and when the top electrode assembly is moved up, the confinement rings are said to be in a disengaged position wherein the inter-ring space/gap is expanded thereby un-sealing the plasma processing region. For instance, when the confinement rings are in engaged position, the inter-ring space is about 20 millimeters (mm) and when in a disengaged position, the inter-ring space is about 120 mms. The top structure also includes a shower head or openings/perforations through which reactive gas, such as Argon, is introduced into the chamber. In addition, a perforated plasma ring structure (not shown)

surrounding the chuck may be defined in the top electrode assembly to allow the gas to be pumped out during plasma processing in the chamber.

In one embodiment, the bottom electrode assembly is an electrostatic chuck assembly (not shown) that includes an electrostatic chuck (ESC) with a substrate support defined on the top side. The ESC is configured to provide electrostatic clamping of a substrate to the substrate support. In one embodiment, the bottom electrode assembly is coupled to one or more radio frequency (RF) power sources (not shown), such as RF generators. In one embodiment, the RF generators may include one or more low-frequency RF generators. In another embodiment, the RF generators may include one or more high-frequency RF generators. In yet another embodiment, the RF generators may include a combination of one or more low-frequency and high-frequency RF generators. In this embodiment, the bottom electrode in the bottom structure is connected to a combination of low-frequency and high-frequency RF generators through respective matching circuitry (not shown) to ensure efficient RF power transmission to the plasma processing region within the chamber. In one embodiment, the low-frequency RF generator is defined to supply RF power having a frequency of 2 MHz, and the high-frequency RF generator is defined to supply RF power having a frequency of either 27 MHz or 60 MHz. In one embodiment where multiple RF generators are used, each of the RF generators can be independently controlled with regard to RF power frequency and/or amplitude.

The liner wall 200a includes a plurality of functional openings, such as an OES port opening 224, a view port opening 226 on one side of the liner wall 200a and an access port 230 (not shown) in another side of the liner wall 200a. Additionally, a door opening 212 is defined on one side of the liner wall 200a. The door opening 212 is used to insert and remove the substrate that is used in the etching operation, into/from the plasma processing region. A via 220 is defined in the liner wall 200a covering one side of the chamber wall 101 through which all cables to and from power sources and other facility hardwire connections are routed.

Figure 3:
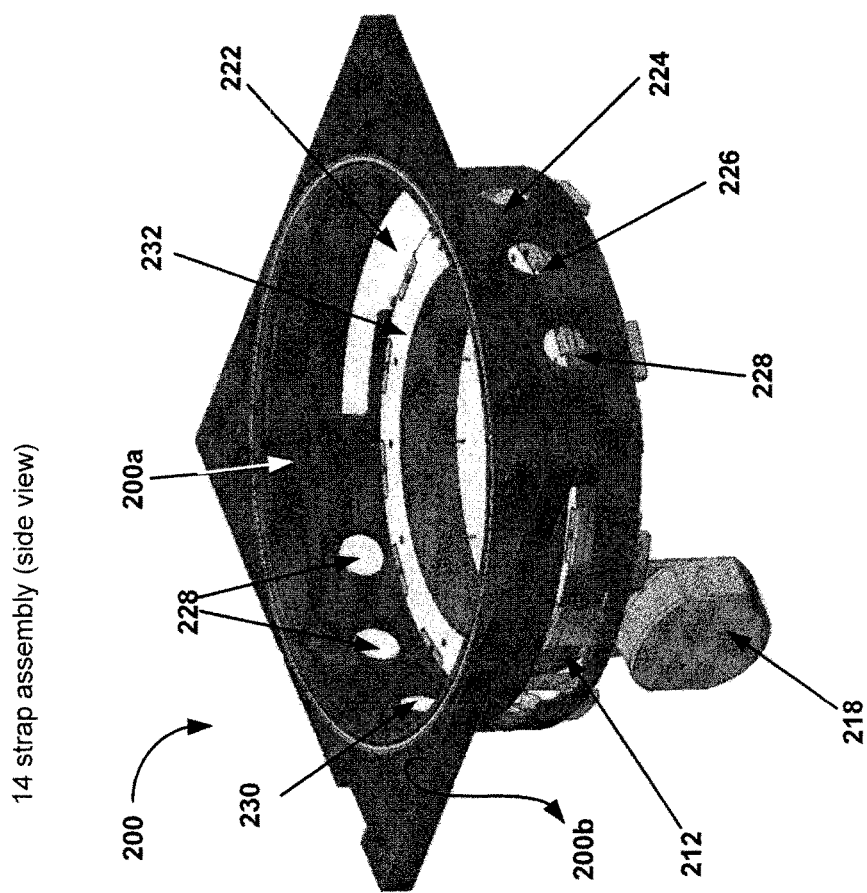
FIG. 3 shows a view of the chamber liner used in providing a symmetric RF return path, according to one embodiment.

In addition to the aforementioned functional openings defined in the liner wall 200a, the liner wall 200a is configured with few dummy functional openings on one or more sides to provide symmetry in an otherwise asymmetrically designed chamber. As shown in FIG. 2, the dummy functional openings may include a dummy door opening 222 that is oriented symmetrically opposite to the door opening 212 through which the substrate is introduced and removed from the plasma processing region. Additional one or more dummy port openings 228 are provided on the inner wall 200a such that these dummy port openings are oriented symmetrically opposite to the functional openings defining the view port, access port and OES port defined in the liner wall 200a. A dummy via 218 is defined in the liner wall 200a that is oriented symmetrically opposite to the via 220 used for routing the chamber related cable and hardwire routings. FIG. 3 illustrates the various dummy functional openings, defined in the liner wall 200a of the inner liner 200.

In addition to the dummy features (i.e. functional openings), a plurality of straps 216 are provided around the bottom of the inner liner to allow uniform and symmetrical conductance of the RF power to the ground. In one embodiment, the straps 216 are flexible straps and are made up of copper material. Other material may be used for the straps 216 so long as the material facilitates conductive RF return path in the chamber. The straps 216 are anchored, at one end, to the bottom portion of the liner wall 200a of the inner liner 200 and are electrically coupled at the other end to a ground ring disposed in the ESC assembly to provide an RF power return path. In one embodiment, the ground ring is adjacent to a silicon hot edge ring surrounding the substrate support of the ESC in the ESC assembly. Orientation of the ground ring will be discussed in detail with reference to FIGS. 4c and 4d. The ground ring is below a ring made of non-conductive material, such as a cover ring made of quartz, to electrically isolate the ESC assembly inside the chamber. The RF power flows evenly and quickly through the conductive strap 216 and ground ring toward the ground circuitry.

A set of control knobs (not shown) may be used to adjust various processing attributes of the reactive gas provided to the chamber, and attributes associated with the chamber used to generate the plasma, including knobs to adjust the RF power supplied to the plasma processing region, adjusting the gap between the plasma confinement rings, adjusting the pressure of the reactive gas in the chamber, etc.

FIG. 3 illustrates an exemplary view of a portion of the inner liner 200 that is introduced into the chamber, in one embodiment of the invention. The inner liner 200 exhibits a symmetrical design due to the dummy functional openings defined in the liner wall 200a. As shown, two dummy port openings 228 are provided in the liner wall 200a on one side oriented to be symmetrically opposite to the OES port 224 and the view port 226 and a dummy port opening 228 is oriented symmetrically opposite to the access port 230. FIG. 3 also illustrates the dummy door opening 222 that is oriented symmetrically opposite to the door opening 212 defined in the liner wall 200a. A dummy via 218 is oriented opposite to the via 220 that houses the chamber related cables and hardwire routings. As too many openings in the liner may result in compromising the functionality of the liner, which is to protect the chamber wall from RF gas coupling, the dummy port openings, in one embodiment, may be filled using quartz plugs. The quartz plugs are non-conductive and will provide the symmetry to the chamber while preventing the RF gas from coupling to the chamber walls.

Figure 4:
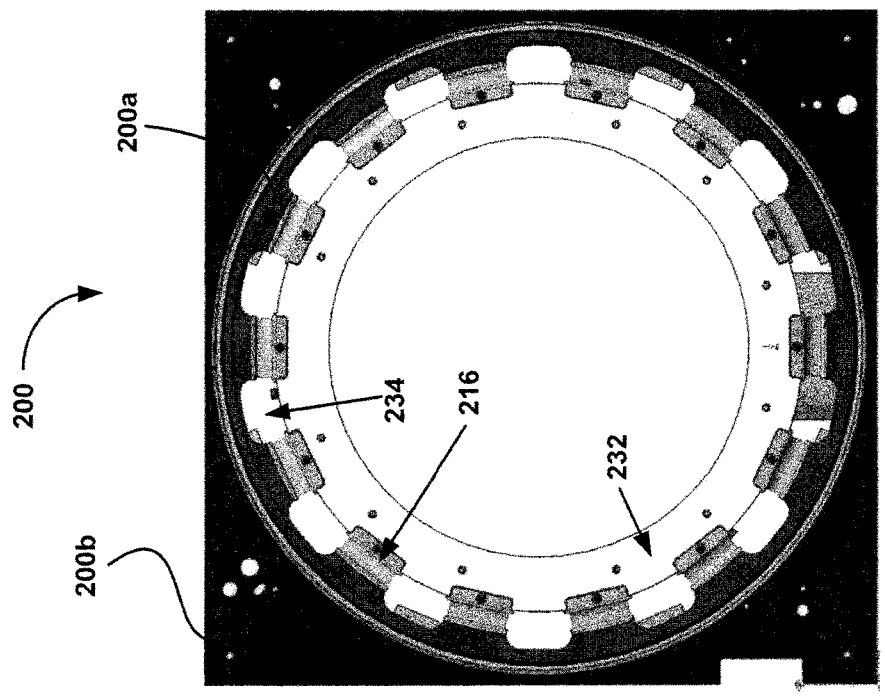
FIG. 4 shows a top view of the inner chamber liner with a plurality of ground straps defined symmetrically around the liner for symmetric RF return, according to one embodiment of the invention.
Figure 4B:
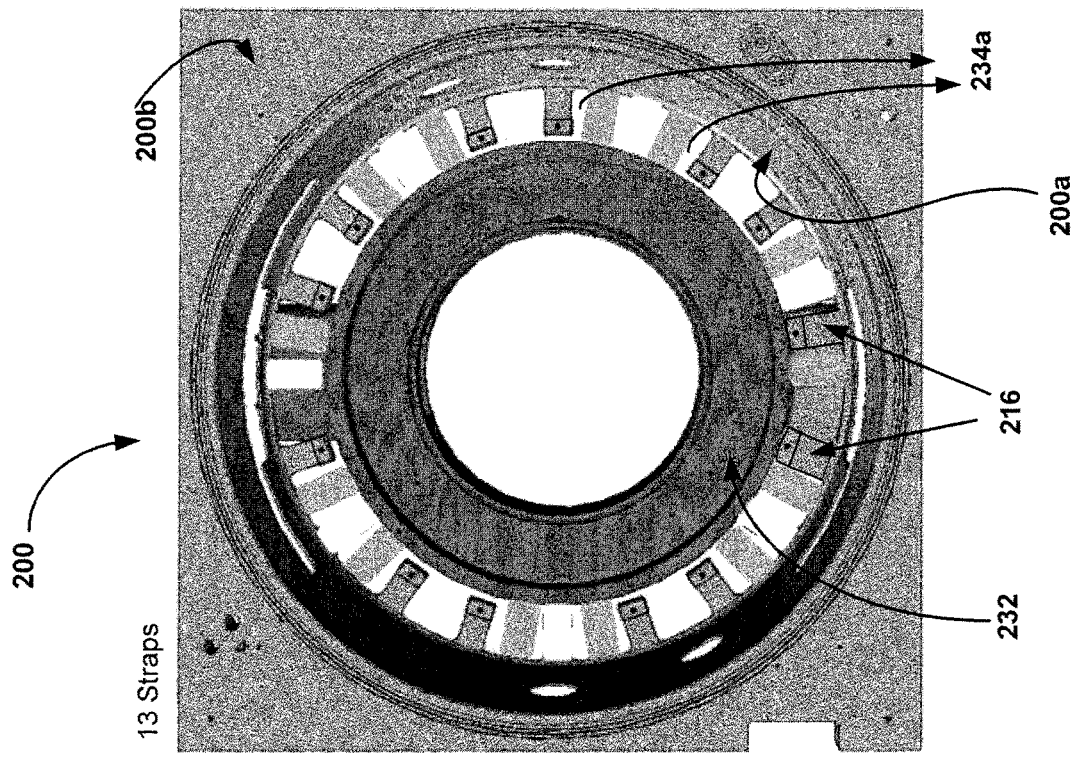
FIGS. 4a and 4b illustrate alternate embodiments with varied number of ground straps disposed symmetrically around the liner, in accordance with alternate embodiments of the invention.
Figure 4A:
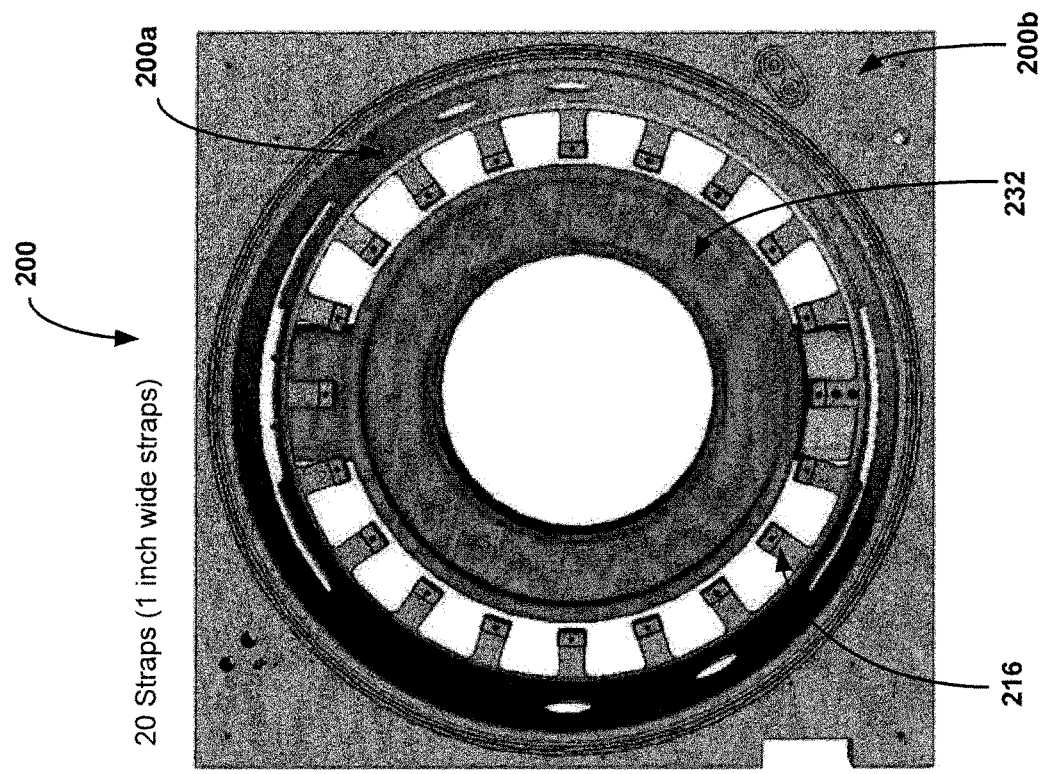

FIG. 4 illustrates a top view of the inner liner 200 with conductive copper straps 216 disposed symmetrically around the bottom portion of the liner wall 200a. As shown in FIG. 4, the inner liner 200 includes liner wall 200a and liner lip 200b. The inner liner 200 is designed with fourteen RF copper straps 216 that are uniformly disposed around the bottom portion of the liner wall 200a and interspersed with symmetric spacing 234 for optimized gas flow conductance and to provide symmetric RF power return path. The size and number of copper straps 216 can vary based on the level of optimization required. FIGS. 4a and 4b illustrate two different variants of a schematic top view of the inner liner with varying number of copper straps 216 that are coupled at one end to the bottom portion of the liner wall 200a and at the other end to a ground ring 232 to provide symmetric RF power return path. In one embodiment illustrated in FIG. 4a, 20 copper straps 216 of 1 inch width with symmetric spacing 234 defined in-between are coupled to the bottom of the liner wall 200a at one end and the ground ring 232 at the other end to provide optimal RF power return path. In one embodiment, 13 copper straps 216 of 2 inch width are disposed uniformly with symmetric spacing 234 defined in-between. In one embodiment illustrated in FIG. 4b, each of the 2 inch copper straps 216 is made up of a pair of one inch width copper straps that are spaced apart with symmetric inter-strap spacing 234a. In this embodiment, each pair of copper straps is spaced apart from its neighboring pair using symmetric spacing 234. In one embodiment, the copper straps 216 are flexible, in that they can be malleable so that they can be stretched. Since the top electrode assembly can move vertically up and down, the flexibility of the copper straps 216 would provide a symmetric RF return path irrespective of which position the top electrode assembly is set.

Figure 4C:
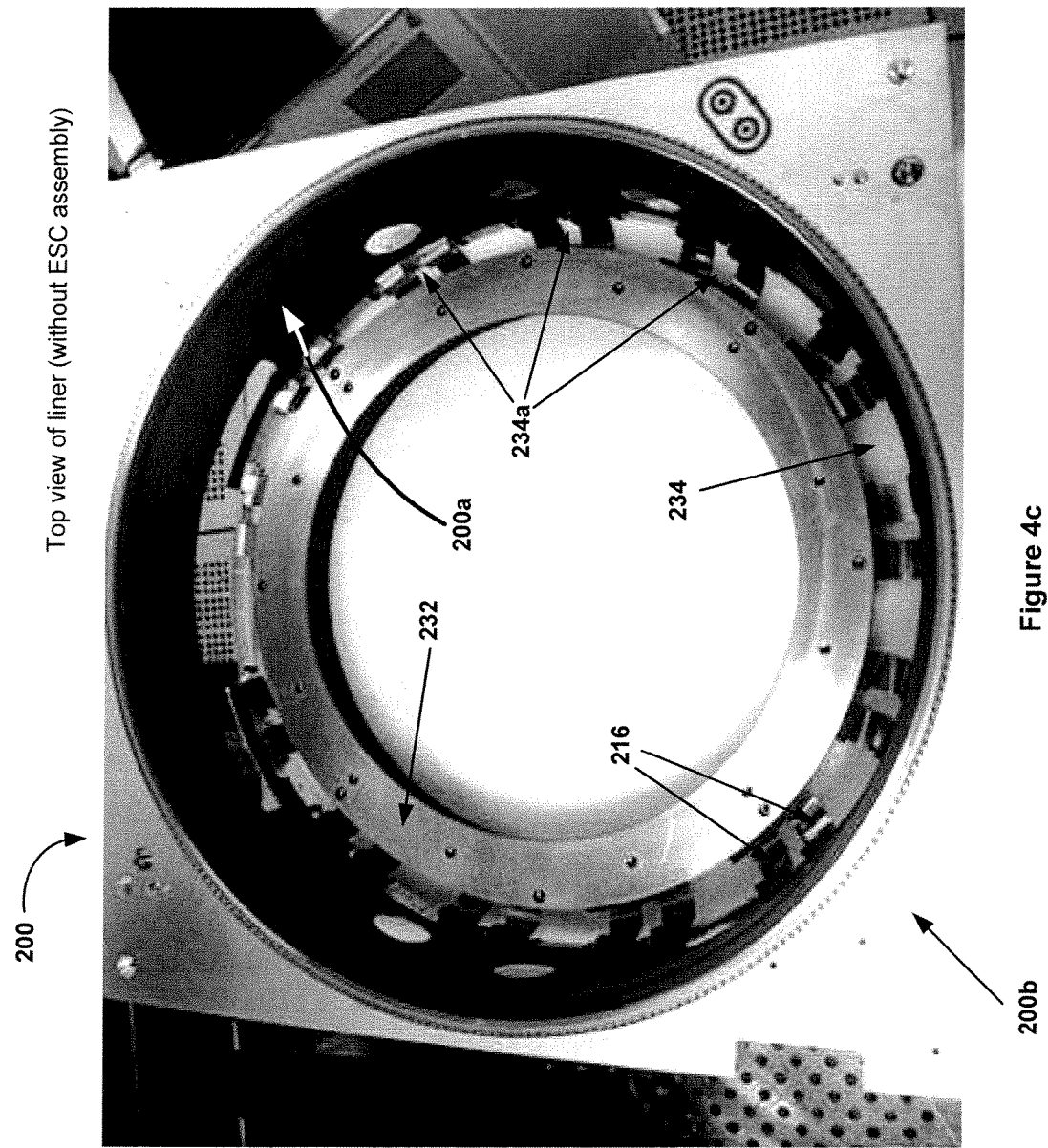
FIGS. 4c and 4d illustrate a top view of the inner chamber liner without ESC assembly and with ESC assembly, respectively, in different embodiments of the invention.
Figure 4D:
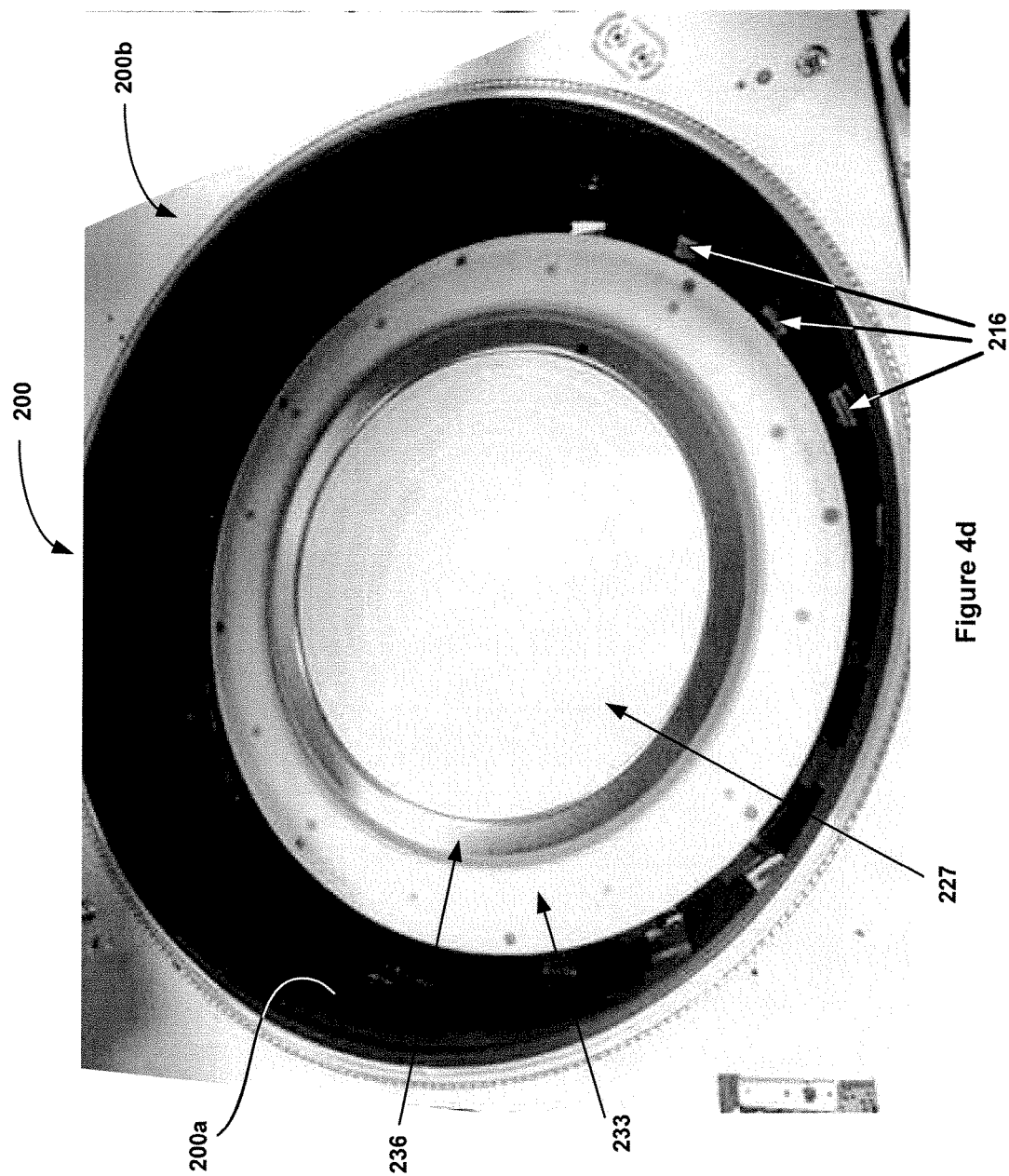

FIG. 4c illustrates an exemplary top view of the inner liner without the ESC assembly. The figure identifies the copper straps 216 attached to the ground ring 232 at one end and to the bottom portion of the liner wall 200a of the inner liner 200 at the other end. FIG. 4d illustrates a top view of the inner liner with the ESC assembly disposed therein. As shown, a silicon hot edge ring 236 is disposed immediately next to the ESC 227 and the ground ring 232 (not shown) is disposed immediately next to the silicon hot edge ring. The ground 232 is covered by a dielectric ring 233. This design helps in providing uniform RF field so that uniform etching can be effectuated on the surface of the substrate and the plurality of copper straps 216 define uniform RF power return path to the ground.

Figure 5A:
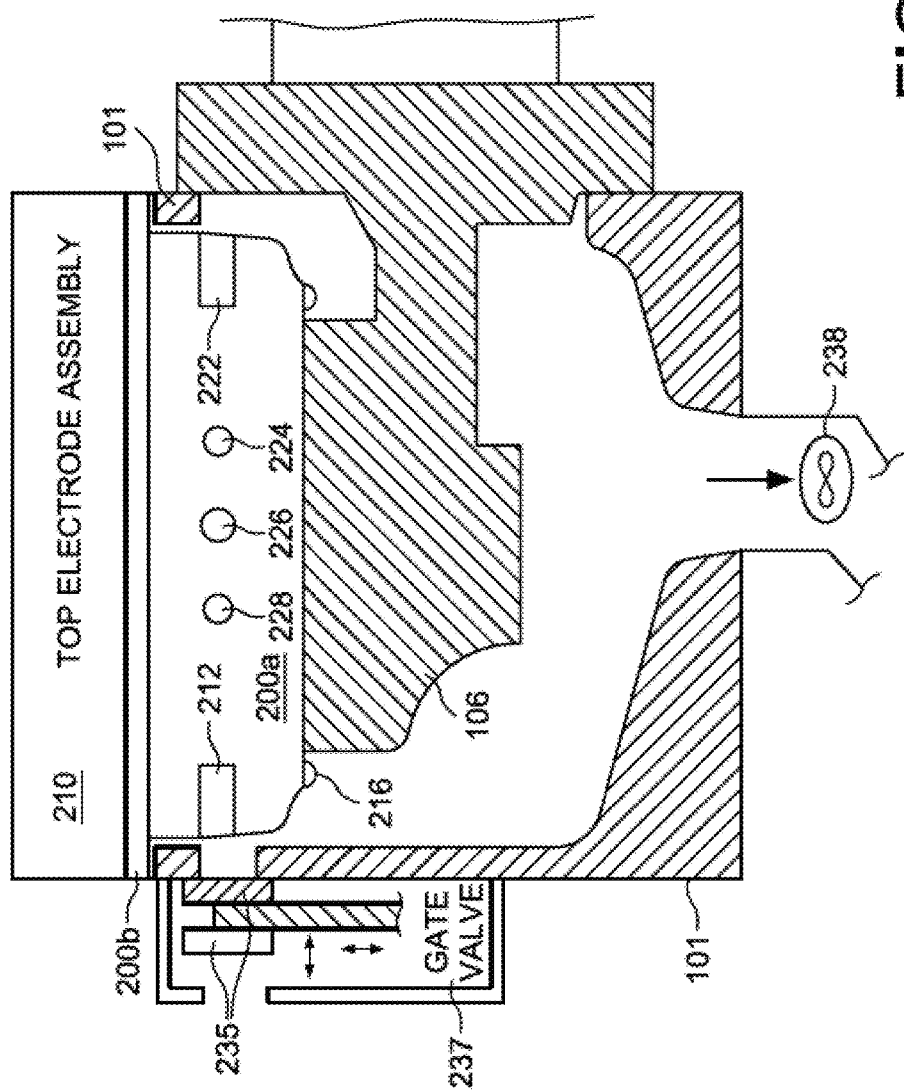
FIG. 5a illustrates a partial cross-section view of the etch chamber, in one embodiment of the invention.

FIG. 5a illustrates a partial cross-sectional view of the etch chamber, in one embodiment of the invention. A door assembly 235 with a gate valve 237 is provided at the door opening 212. The gate valve 237 may be a single gate valve or may be a dual valve. The gate valve 237 is structured to move up, down and sideways to enable the door opening 212 to be accessible for moving a substrate into and out of the chamber and for closing during an etching operation. A fan 238 is provided at the bottom of the chamber to enable removal of any heat building up within the chamber. As mentioned earlier, opposite to the door opening 212 that is used for inserting and removing the substrate into and from the chamber, a dummy door opening 222 is defined to provide design symmetry. As previously mentioned, the dummy door opening 222 may be plugged using an insulation material, such as a quartz plug so as to prevent RF plasma from leaking outside and coupling to the chamber wall 101. A dummy port opening 228 is oriented opposite to port openings 224, 226 and 230. It should be noted that the chamber includes other assembly that are not described in detail in order not to unnecessarily obscure the present embodiments.

Figure 5B:
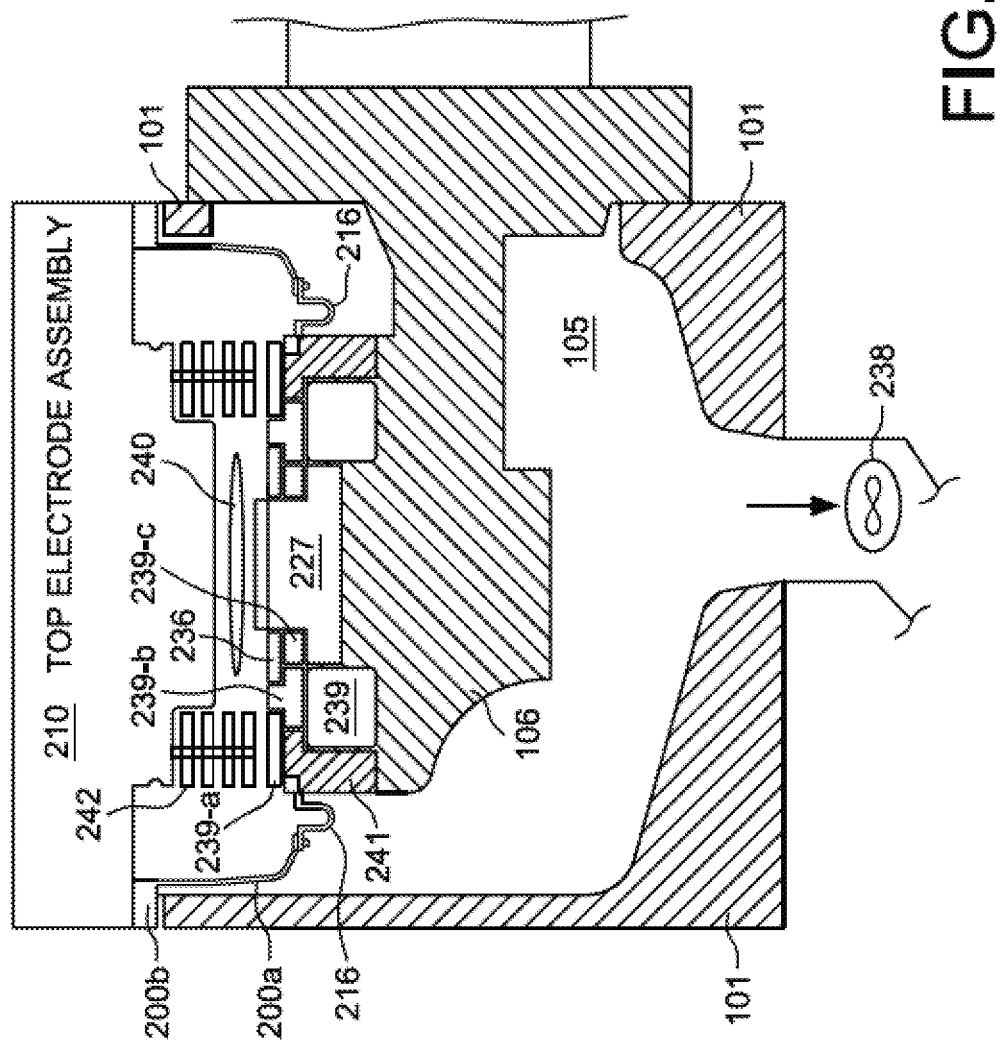
FIG. 5b illustrates a cross-sectional view of the etch chamber, in one embodiment of the invention.

FIG. 5b illustrates a full cross sectional view of the etch chamber including the various insulating materials surrounding and isolating the ESC assembly 106. As shown, the etch chamber includes a top electrode assembly 210 disposed in a top structure and a bottom electrostatic chuck assembly 106 disposed in a bottom electrode structure 105 and an inner liner 200 between the top and bottom electrode structures alongside the chamber wall 101 and spaced apart from the chamber wall 101. The ESC assembly 106 includes an ESC 227 disposed therein. The inner liner 200 includes liner wall 200a extending the height between the top electrode assembly and the bottom electrode assembly and surrounding the plasma processing region 240 and a liner rim or liner lip 200b. The ESC 227 within the ESC assembly 106 provides a substrate support on the top side and is configured to provide electrostatic clamping of the substrate (or the wafer) to the substrate support, when substrate is present. A silicon hot edge ring 236 is disposed immediately adjacent to the substrate support of the ESC 227 to provide uniform RF field for etching. In one embodiment, a probe may be placed in the hot edge ring to detect any shift in bias within the chamber. Any shift in bias within the chamber would be indicative of plasma leakage from the chamber.

Below the silicon hot edge ring 236 is a quartz coupling ring 239-c. Adjacent to the silicon hot edge ring 236 are a set of cover rings. An inner cover ring 239-b in the shape of an inverted "T" is immediately next to the silicon hot edge ring 236 and the outer cover ring 239-a is next to the inner cover ring 239-b. Below the outer cover ring is a ground ring 241. The plurality of copper straps 216 are coupled to the ground ring 241 at one end and to the bottom portion of the liner wall 200a at the other end to provide a symmetric path for the RF power for returning to the ground. A quartz focus ring 239 is underneath the quartz elements. A thin layer of quartz cover ring is defined over the various quartz elements separating the ESC from the inner chamber liner of the chamber and, hence, from the RF power return path.

A plasma confinement ring structure 242 with a plurality of confinement rings is designed in the top electrode assembly 210 to confine the plasma within the plasma processing region 240. The plasma confinement ring 242 includes a set of spacers that can be moved vertically. The spacers define inter-ring gaps in the plasma confinement ring structure that can be fully expanded or compressed. For a tight seal of the chamber, the spacers can be moved downward to a compressed configuration so as to prevent the plasma from escaping and can be moved upward to an expanded configuration to allow the reactive gas in the plasma confinement region to escape. Controls, such as control knobs (not shown), available at the chamber may be engaged to adjust process attributes, such as spacing adjustment of the inter-ring gaps defined between the plasma confinement rings, so as to arrest or prevent any leaks of the plasma from the plasma processing region 240 of the chamber.

The top electrode assembly 210 is moveable up, down and sideways to provide access to plasma processing region 240. A liner rim 106 of the inner liner is designed to receive the top electrode assembly 210 so as to seal the chamber during the etching operation. It should be noted that, in one embodiment, the liner rim and the liner walls are all part of a single piece structure. The liner wall 200a is designed with functional openings, such as the port openings, via and door opening. In addition to the features, a set of dummy functional openings are also defined on the liner wall 200a of the inner liner that are symmetrically opposite to the features, as described above.

The symmetric design of the chamber in the various embodiments discussed herein allows the spacers between the plasma confinement rings to be moved during plasma processing so as to allow more reactive gas to be supplied to the chamber during plasma processing. For instance, the symmetric design of the chamber allows for improved plasma confinement within the chamber for various copper strap configurations while minimizing plasma leakage to the surrounding area outside of the plasma processing region. As more and more gas is allowed to flow into the plasma confinement ring, the plasma confinement rings are opened up so as to maintain optimal pressure of the plasma in plasma processing region. The opening up of the plasma confinement ring can potentially lead to plasma leaking from the plasma confinement region to the outside due to increase in the inter-ring gap, and thereby leading to potential coupling with the chamber wall. However, as the various confinement test runs show, the symmetrically designed chamber enables better plasma confinement before the plasma leaks from the plasma confinement region through the confinement rings to the outside chamber wall. In one embodiment, the plasma confinement ring configuration can be adjusted to define inter-ring gap so as to prevent plasma leakage to outside of the plasma confinement ring. In one exemplary embodiment, the adjustability range for the inter-ring gap is from about 17 mm to about 36 mm without the fear of plasma leakage to the outside of the plasma confinement region, which could lead to the coupling of the RF plasma to the chamber wall. The copper straps, in one embodiment, may be coated with an insulating material to prevent damage to the copper strap that can compromise the RF power return path. Some examples of insulating material used include Rhodorsil™, Kapton™, perfluoroalkoxy polymer resin (PFA), Polyimide/Polyamide-imide. The above list is exemplary and should not be considered limiting. Other insulating materials may be used so long as the functionality of the copper straps is maintained.

Monitors placed in the OES port at the inner chamber liner will measure the plasma intensity in an outer region defined outside of plasma confinement region and a probe provided at the hot edge ring will monitor the shift in bias within the plasma confinement region to indicate any plasma leakage. As discussed with reference to FIG. 9, the plasma confinement is significantly better with the improved symmetrically designed chamber.

Figure 5C:
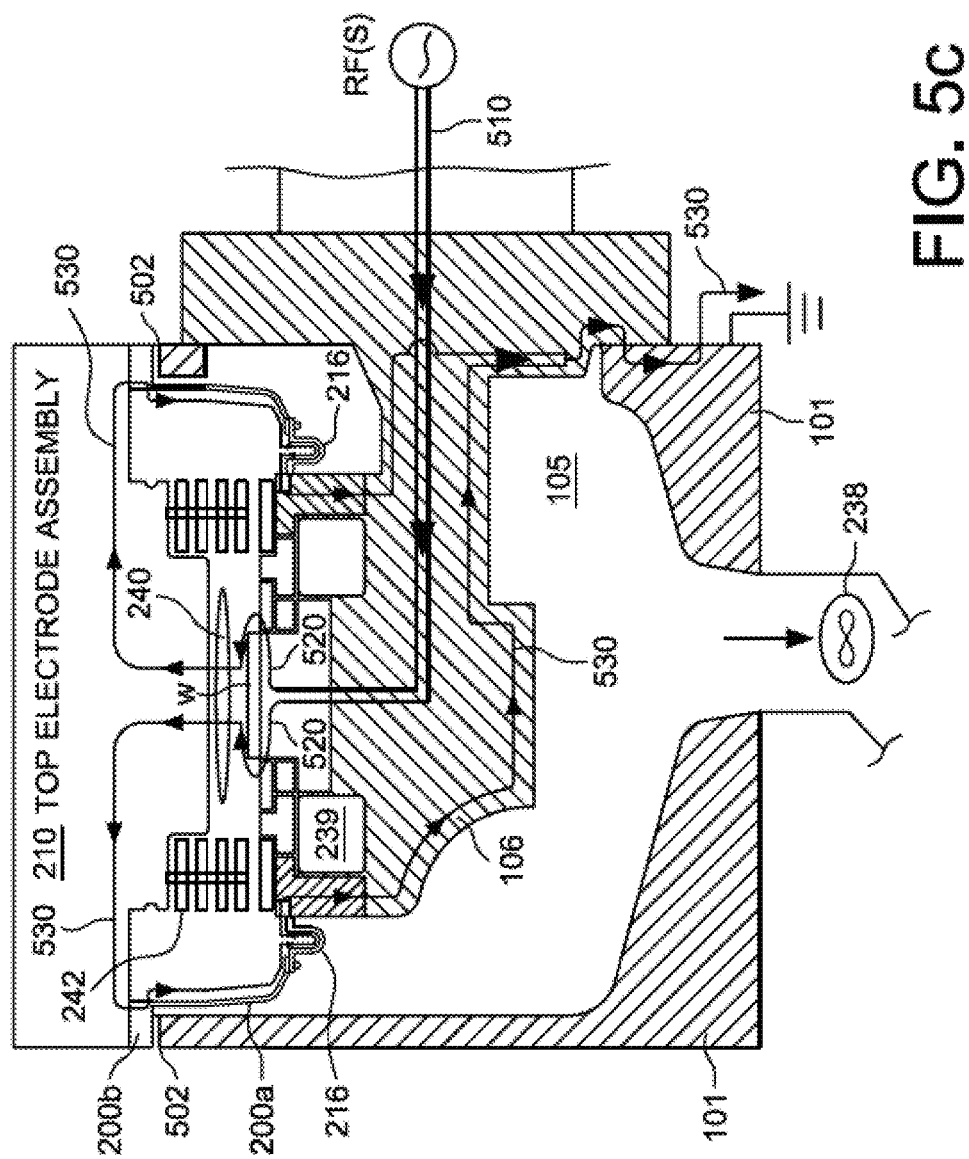
FIG. 5c illustrates a RF return path in the etch chamber, in one embodiment of the invention.

FIG. 5c illustrates an exemplary view of a return path for RF power defined by the symmetrical chamber, in one exemplary embodiment of the invention. As shown, the RF power is provided to the ESC assembly through one or more RF power source, as illustrated by path 510. The RF power travels through the ESC assembly via path 510 and the quartz coupling ring toward the plasma confinement region, as illustrated by path 520, where reactive gas is supplied through a shower head or openings defined in the top electrode assembly. The RF power generates the plasma of the reactive gas through capacitive coupled plasma (CCP) discharge. For the CCP discharge, an electric field is excited between two electrodes in an etching chamber to obtain RF gas discharge by applying an oscillating voltage. During the CCP discharge, the plasma confinement ring may be brought to a compressed configuration to seal the chamber. As gas is pumped into the plasma confinement region during the etching operation to increase the concentration of the ions, the pressure can increase in the chamber. In order to release some of the pressure within the plasma confinement region, the plasma confinement ring may be partially brought to an expanded configuration and the excess gas removed through perforations provided in the quartz ring defined in the top electrode assembly 210. The RF power from the plasma confinement region flows through a conductive path 530 defined through the top electrode assembly, the inner liner and the copper straps. The conductive path 530 continues through the ground ring inside the bottom electrostatic chuck assembly and finally towards the ground. The size and number of copper straps enables the RF power return to be symmetrical. Further, the symmetrical design of the inner liner enables an improved symmetric conductance of the reactive gas in the plasma confinement region and optimal inductance reduction.

Figure 5D:
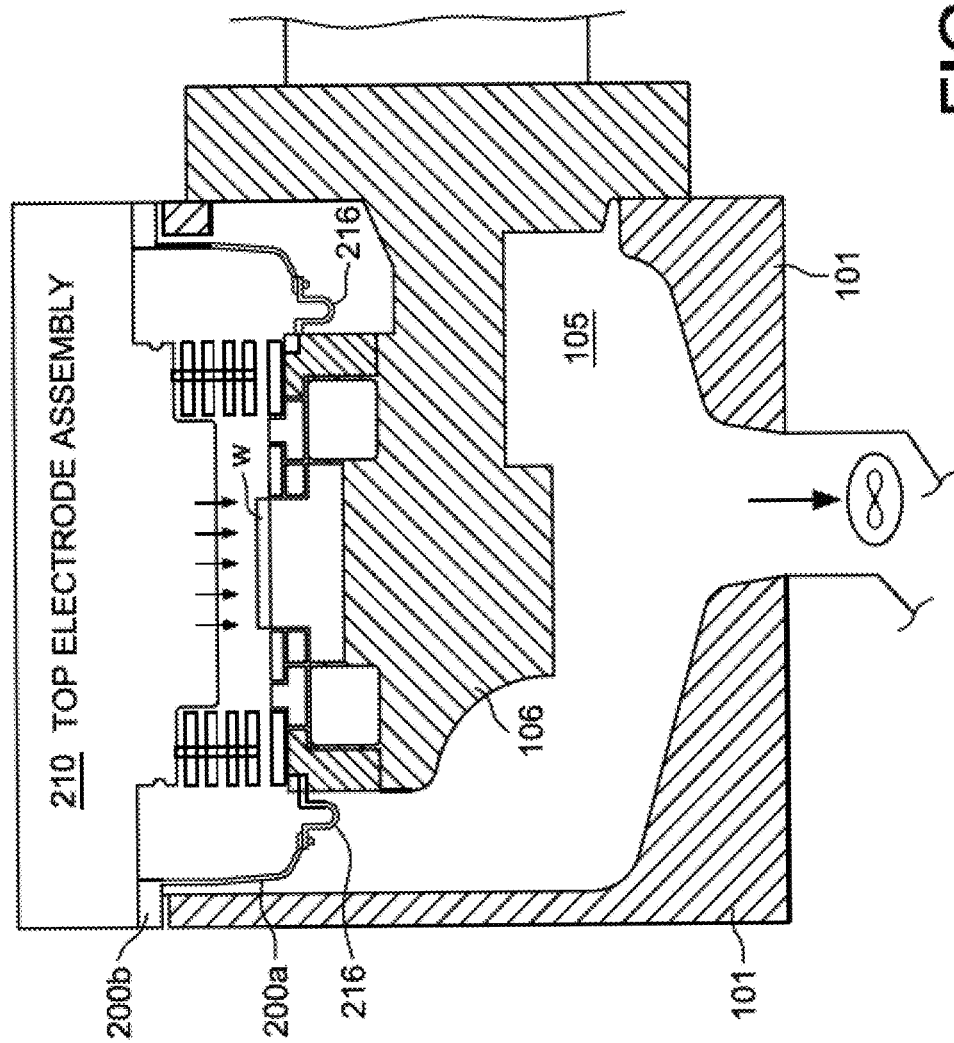
FIG. 5d illustrates a shower head configured in a top electrode assembly of a top structure, in one embodiment of the invention.

FIG. 5d illustrates a gas showerhead defined in the top electrode assembly 210 for supplying gas into the plasma confinement region of the chamber, in one embodiment of the invention. The showerhead provides uniform supply of gas from a gas supply source (not shown) so that the gas can be converted to plasma using the RF power provided from the ESC assembly 106 during the etching operation. It should be noted that supplying of gas into the plasma confinement region is not restricted to shower head but other mechanisms can also be used so long as the mechanism is capable of supplying the gas into the plasma confinement region.

Figure 6:
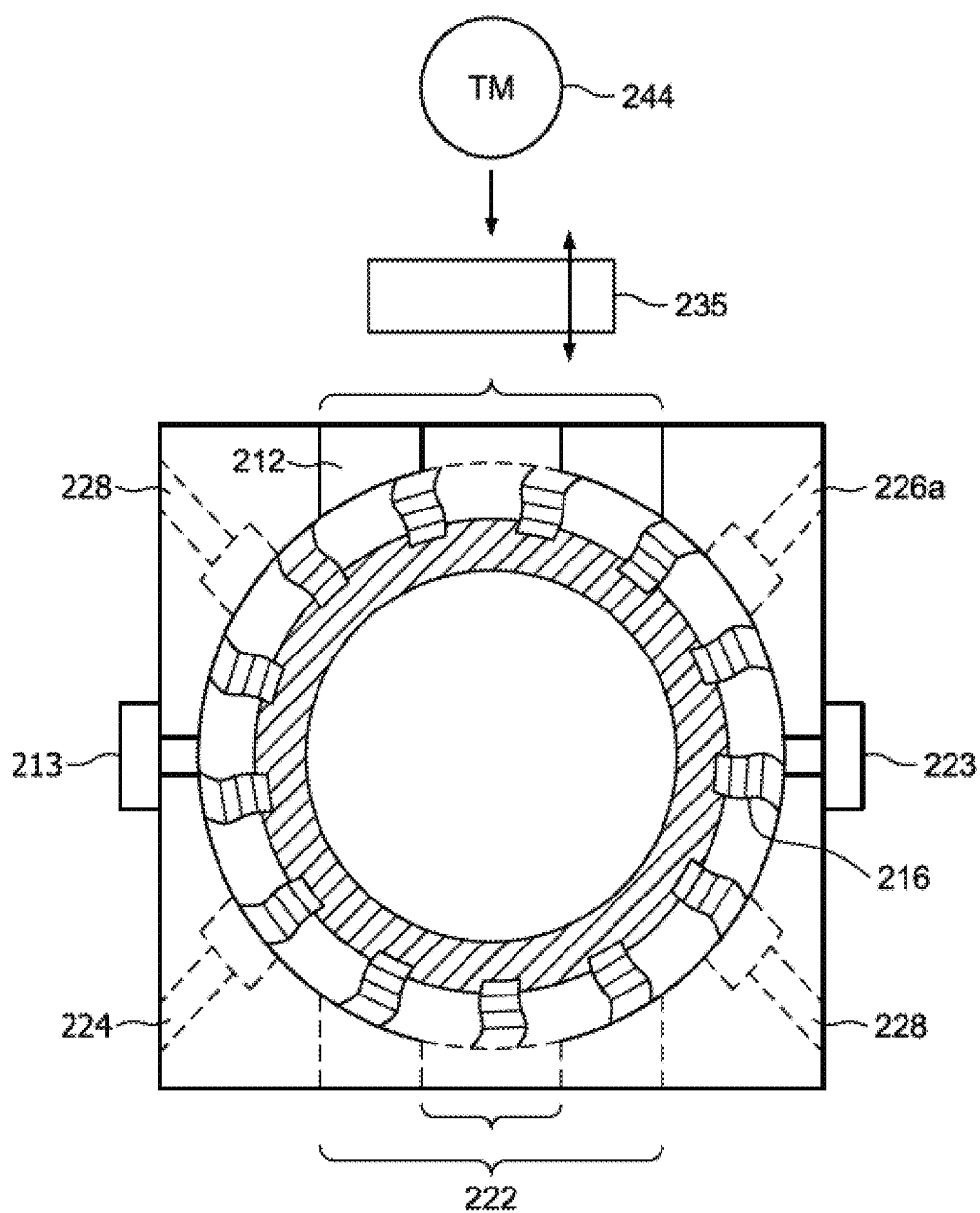
FIG. 6 illustrates a top view of a rendition of an etch chamber, in one embodiment of the invention.

FIG. 6 illustrates a schematic top view of an inner liner of a etch chamber that includes the optimal number of copper straps, dummy port openings 228, dummy door opening 222 and dummy via, in one embodiment of the invention. As shown, each of the functional openings/features that is defined on the liner walls of the inner liner has a matching dummy functional opening/feature defined in the liner wall that is symmetrically opposite to the existing functional feature. A door opening 212 associated with a door assembly 235 through which a transfer module 244 deposits the substrate into the etch chamber has a matching dummy door opening 222 that is symmetrically opposite to the door on the inner liner wall. An optical port 224, a window 223, a monometer port 226a, a view port 226, a via 220 that is defined on the liner wall has an equivalent dummy counterpart so that the liner wall is symmetric for symmetric gas conductance. A plurality of conductive straps 216, such as copper straps, is provided at uniform intervals around the perimeter of the bottom portion of the liner wall. The straps are attached to the bottom portion of the liner wall at one end and to the corresponding location in the ground ring of the ESC assembly at the opposite end using conductive blocks, such as aluminum blocks, in one embodiment. These straps 216 enable uniform and symmetric conductance of the RF return. The dummy features along with the plurality of straps provide the necessary symmetry for conductance of the gas and uniform RF power return path.

Figure 7:
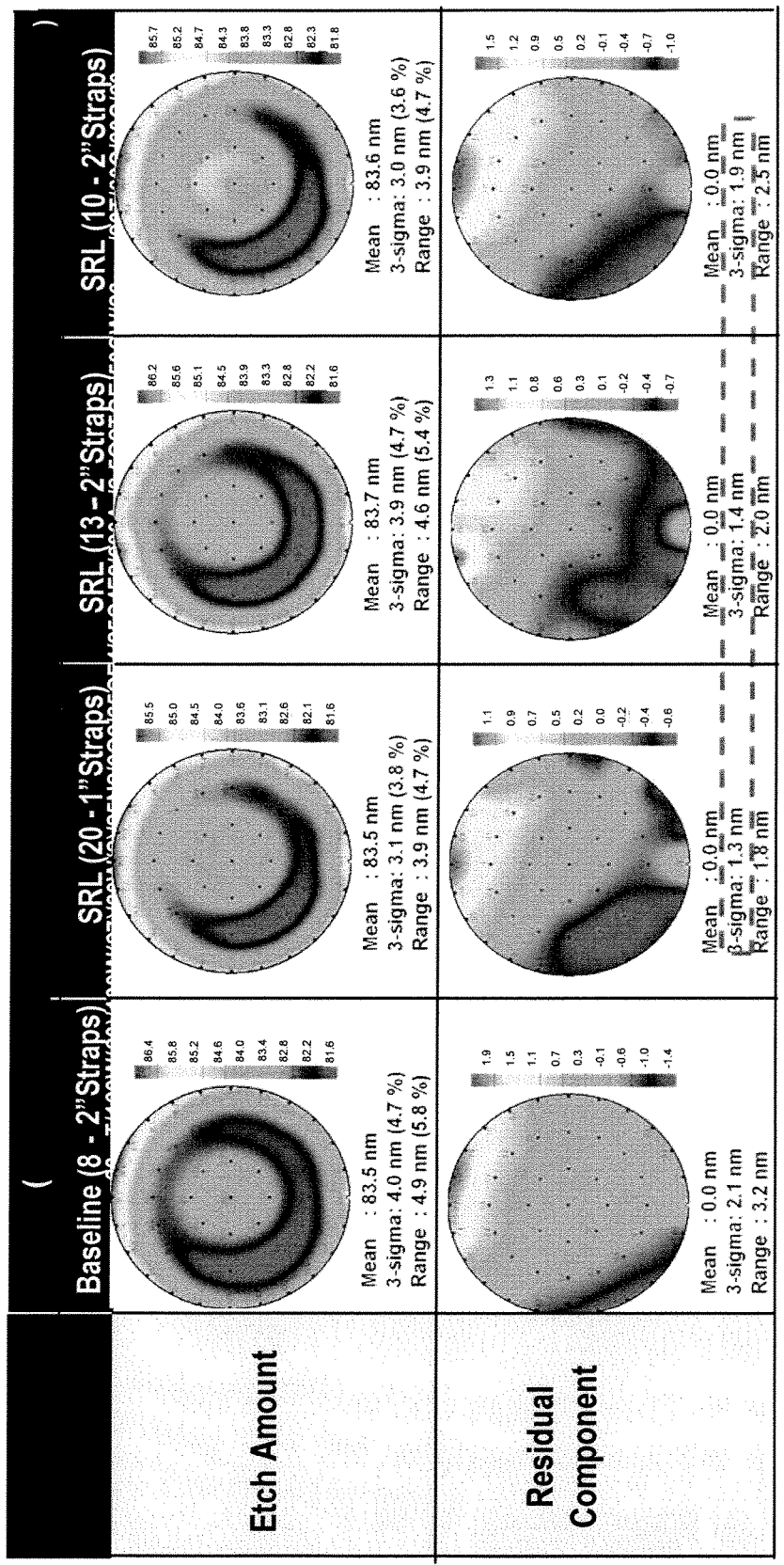
FIG. 7 illustrates etch results that identifies azimuthal uniformity using embodiments of the invention, in one embodiment of the invention.
Figure 8:
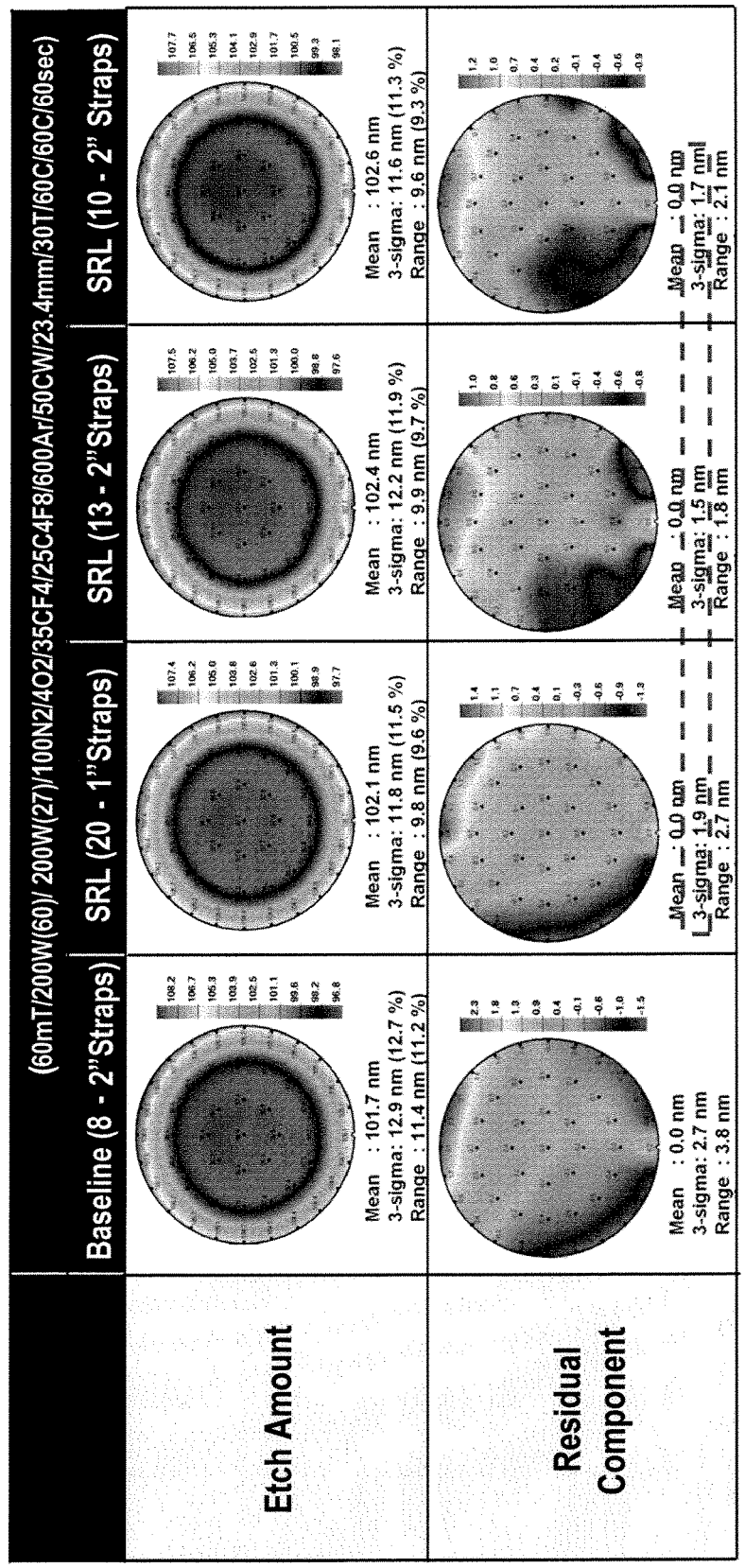
FIG. 8 illustrates a graphical representation identifying improvement in azimuthal uniformity with the current chamber liner configuration, according to one embodiment.

FIGS. 7 and 8 illustrate the etch rate azimuthal uniformity for various configurations of conductive copper straps in different embodiments. As illustrated, the residual component, which is hardware related and which can be controlled using one or more control knobs provided at the process chamber, shows significant improvement with increase in the number of copper straps with an optimal improvement achieved using 13 2" straps followed by the 20 1" straps, as illustrated with a dashed red box in FIGS. 7 and 8. FIGS. 7 and 8 differ in the type of gases used in relation to different configuration of the straps. As illustrated in FIGS. 7 and 8, some of the gases used include Nitrogen (N2)/Oxygen (O2)/tetrafluoro methane (CF4)/Octafluorocyclo butane (C4F8), and Argon. The list of gases is exemplary and should not be considered restrictive. The two gas recipes used in FIGS. 7 and 8 vary, with the differences in the two recipes being related to optimized pressure, gas flow, power and inter-ring gap height for the two recipes.

FIG. 9 illustrates a graphical comparison of plasma confinement performance with different confinement tests. With the RF frequency provided through the RF sources being a mixture of high and low-frequencies, the different configuration of the RF straps have shown improved plasma confinement performance. As shown in FIG. 9, the plasma confinement using symmetrically designed inner liner of current embodiments, with 20 1" ground straps and dual frequency RF generators of 2 MHz and 27 MHz frequency at a maximum power for the plasma chamber/reactive gas, is about 1350 sccm (standard cubic centimeters per minute) of reactive gas, such as Argon, as opposed to about 1000 sccm of Argon when 8 2" ground straps were used. Similarly, the plasma confinement showed an improvement from 975 sccm of Ar to about 1000 sccm of Ar when 20 1" ground straps and dual frequency RF generators of 2 MHz and 60 MHz were used. It should be noted that the graph of FIG. 9 shows readings that were recorded prior to detecting any leak of plasma from the plasma chamber. The plasma confinement performance consistently showed improvement through multiple runs, as evidenced from the plasma confinement chart of FIG. 9. In one embodiment, the maximum power is defined by the etching tool and for the type of devices being etched in the etching chamber. For example, in one embodiment where logic elements are being etched, the maximum power applied could be about 1 kilo watts (KW). In another embodiment where memory elements are being etched, the maximum power applied could be between about 2.0 KW to about 2.5 KW. It should be noted that the maximum power for the tool should be in the above range in order to prevent potential plasma unconfinement.

With the above embodiments in mind, it should be understood that the invention can employ various computer-implemented operations involving data stored in computer systems. These operations are those requiring physical manipulation of physical quantities. Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments of the present invention can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A chamber for plasma processing a substrate using RF power, comprising:

the chamber having walls for housing an electrostatic chuck (ESC) and a top electrode, the top electrode oriented opposite the ESC to define a processing region;

an inner liner having tubular shaped wall defined within the walls of the chamber and spaced apart from the walls of the chamber, the inner liner being oriented to surround the processing region and the tubular shaped wall extending a height between a bottom and a top, the tubular shaped wall having functional openings for substrate access and facilities access, and further including dummy openings oriented symmetrically opposite to selected ones of the functional openings so as to define symmetry for the selected ones of the functional openings, wherein the dummy openings are filled using insulating material plugs;

a plurality of straps connected to the bottom of the tubular shaped wall of the inner liner, the plurality of straps further being electrically coupled to a ground ring within the chamber to provide an RF power return path to ground during the plasma processing, the ground ring configured to surround the ESC having a substrate support, the ground ring disposed at a level that is below the substrate support;

a dummy via defined to extend downward from the bottom of the tubular shaped wall of the inner liner and oriented on a side that is symmetrically opposite to a side of the tubular shaped wall of the inner liner that includes a via, wherein the dummy via is filled using an insulating material plug, the dummy via and the via are oriented below one or more of the plurality of straps that are connected to the bottom of the inner liner, wherein the via provides an opening that is used to route facility connections for the chamber and the dummy via is used to provide a structural symmetry inside the chamber;

an edge ring configured to surround the substrate support of the ESC; and a dielectric ring disposed over the ground ring, such that a space between the dielectric ring and the tubular shaped wall of the inner liner remains for gas flow conductance, the plurality of straps are distributed uniformly around and between the bottom portion of the tubular shaped wall of the inner liner and the ground ring with symmetric spacing defined there-between for facilitating said gas flow conductance.

2. The apparatus of claim 1, wherein the number of straps is selected from any one of a group of 13 straps, a group of 14 straps, and a group of 20 straps.

3. The apparatus of claim 2, wherein the number of straps is selected from a group of 13 pairs of straps or a group of 14 pairs of straps, wherein the pairs of straps have symmetric inter-strap spacing defined there-between.

4. The apparatus of claim 1, wherein the plurality of straps are made of copper.

5. The apparatus of claim 4, wherein the plurality of straps are coated with an insulating material.

6. The apparatus of claim 5, wherein the insulating material is anyone from a group consisting of Rhodorsil, Kapton, perfluoroalkoxy polymer resin (PFA), and Polyimide/Polyamide-imide.

7. The apparatus of claim 1, wherein the dummy openings include dummy port openings, and dummy door openings.

8. The apparatus of claim 1, wherein the insulating material is quartz.

9. A system for plasma processing a substrate using radio frequency (RF) power, comprising:

a chamber having walls for housing an electrostatic chuck (ESC) and a top electrode, the top electrode oriented opposite the ESC to define a processing region;

an inner liner having tubular shaped wall defined within the walls of the chamber and spaced apart from the walls of the chamber, the inner liner being oriented to surround the processing region and the tubular shaped wall extending a height between a bottom and a top, the tubular shaped wall having functional openings for substrate access and facilities access, and further including dummy openings oriented to define symmetry for selected ones of the functional openings, wherein the dummy openings are filled using insulating material plugs;

a plurality of straps connected to bottom portion of the tubular shaped wall of the inner liner at one end and electrically coupled to a ground ring within the chamber at an opposite end to provide RF power return path to ground during the plasma processing, the ground ring disposed to surround the ESC having a substrate support, the ground ring is disposed at a level that is below the substrate support;

a dummy via defined to extend downward from the bottom of the tubular shaped wall of the inner liner and oriented on a side that is opposite to a side of the tubular shaped wall of the inner liner that includes a via, the dummy via is filled using an insulating material plug, the dummy via and the via are oriented below one or more of the plurality of straps that are connected to the bottom of the inner liner, wherein the via is used to route facility connections for the chamber and the dummy via is used to provide a structural symmetry inside the chamber;

an edge ring disposed to surround the substrate support of the ESC;

a dielectric ring is disposed adjacent to the edge ring and configured to surround the edge ring, the dielectric ring is spaced apart from the tubular shaped wall of the inner liner, the ground ring defined below the dielectric ring;

a quartz ring is defined adjacent to the ground ring, such that the quartz ring is between at least a portion of the ground ring and the ESC;

the plurality of straps are distributed uniformly around the bottom portion of the tubular shaped wall of the inner liner and oriented between the bottom portion of the tubular shaped wall and the ground ring with symmetric spacing defined there-between for facilitating gas flow conductance;

an RF power source coupled to the electrostatic chuck for providing RF power to the processing region; and a process gas source connected to the top electrode for supplying process gas to the processing region.

10. The system of claim 9, wherein the RF power source further includes, a first RF power source and a second RF power source, wherein the first RF power source is configured to provide low frequency RF power of about 2 MHz and the second RF power source is configured to provide high frequency RF power of about 27 MHz.

11. The system of claim 9, further includes, a first RF power source and a second RF power source, wherein the first RF power source is configured to provide low frequency RF power of about 2 MHz and the second RF power source is configured to provide high frequency RF power of about 60 MHz.

12. The system of claim 9, further includes a plurality of control knobs to adjust processing attributes of gas plasma generated within the plasma processing region of the plasma chamber from the process gas supplied by the top electrode.

13. The system of claim 9, wherein the number of straps is selected from any one of a group of 13 straps, a group of 14 straps, or a group of 20 straps.

14. The system of claim 9, wherein the number of straps is selected from a group of 13 pairs of straps or a group of 14 pairs of straps, wherein the pairs of straps have symmetric inter-strap spacing defined there-between.

15. The system of claim 9, wherein the dummy openings include dummy port openings, and dummy door openings, wherein the insulating material is quartz.

* * * * *